US011205482B2

(12) United States Patent
Hioka et al.

(10) Patent No.: US 11,205,482 B2
(45) Date of Patent: Dec. 21, 2021

(54) SEMICONDUCTOR STORAGE DEVICE

(71) Applicant: KIOXIA CORPORATION, Tokyo (JP)

(72) Inventors: Takeshi Hioka, Machida Tokyo (JP); Koji Kato, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/806,282

(22) Filed: Mar. 2, 2020

(65) Prior Publication Data
US 2020/0381052 A1 Dec. 3, 2020

(30) Foreign Application Priority Data

May 28, 2019 (JP) .............................. JP2019-099649

(51) Int. Cl.
| | |
|---|---|
| *G11C 16/08* | (2006.01) |
| *G11C 16/12* | (2006.01) |
| *G11C 16/26* | (2006.01) |
| *G11C 7/22* | (2006.01) |
| *G11C 16/34* | (2006.01) |
| *G11C 16/04* | (2006.01) |
| *G11C 16/24* | (2006.01) |

(52) U.S. Cl.
CPC ............... *G11C 16/08* (2013.01); *G11C 7/22* (2013.01); *G11C 16/0433* (2013.01); *G11C 16/12* (2013.01); *G11C 16/24* (2013.01); *G11C 16/26* (2013.01); *G11C 16/34* (2013.01)

(58) Field of Classification Search
CPC ......... G11C 16/08; G11C 16/12; G11C 16/26; G11C 7/22; G11C 16/34; G11C 16/0433; G11C 16/24; G11C 16/0438

USPC ........................................ 365/185.22, 185.24
See application file for complete search history.

(56) References Cited

U.S. PATENT DOCUMENTS

| | | | |
|---|---|---|---|
| 9,548,127 B1 * | 1/2017 | Takada | G11C 16/26 |
| 9,792,996 B1 * | 10/2017 | Date | G11C 16/0483 |
| 10,115,464 B1 * | 10/2018 | Lu | G11C 11/5642 |
| 10,121,551 B1 * | 11/2018 | Miller | G11C 11/5628 |
| 10,903,360 B1 * | 1/2021 | Hekmatshoartabari | G11C 11/1657 |
| 2002/0093864 A1 * | 7/2002 | Ooishi | G11C 11/406 365/222 |
| 2005/0185474 A1 * | 8/2005 | Atwood | G11C 11/405 365/189.15 |

(Continued)

FOREIGN PATENT DOCUMENTS

JP       2018-160295 A    10/2018

*Primary Examiner* — Michael T Tran
(74) *Attorney, Agent, or Firm* — Kim & Stewart LLP

(57) ABSTRACT

A semiconductor storage device includes a plurality of memory cells connected to each other in series, a plurality of word lines respectively connected to gates of the plurality of memory cells, and a control circuit configured to perform a read operation by applying a first voltage higher than ground voltage to the plurality of word lines during a first time period at the beginning of which each word line is at ground voltage, applying a second voltage lower than the first voltage to a first word line during a second time period subsequent to the first time period, applying a third voltage higher than the second voltage to the first word line during a third time period subsequent to the second time period, and determining data of the memory cells connected to the first word line while all portions of the first word line are at the third voltage.

20 Claims, 9 Drawing Sheets

(56) References Cited

U.S. PATENT DOCUMENTS

| | | | | |
|---|---|---|---|---|
| 2005/0225917 A1* | 10/2005 | Gnat | ............... | G11C 29/12 |
| | | | | 361/91.1 |
| 2006/0133143 A1* | 6/2006 | Hosono | ............ | G11C 16/12 |
| | | | | 365/185.11 |
| 2006/0171209 A1* | 8/2006 | Sim | ............... | H01L 29/792 |
| | | | | 365/185.28 |
| 2006/0203565 A1* | 9/2006 | Lee | ............... | G11C 16/30 |
| | | | | 365/185.29 |
| 2006/0227613 A1* | 10/2006 | Joo | ............... | G11C 16/3418 |
| | | | | 365/185.18 |
| 2006/0279991 A1* | 12/2006 | Park | ............... | H01L 27/115 |
| | | | | 365/185.17 |
| 2007/0258289 A1* | 11/2007 | Lue | ............... | G11C 16/0483 |
| | | | | 365/185.18 |
| 2007/0291567 A1* | 12/2007 | Mokhlesi | ............ | G11C 16/26 |
| | | | | 365/212 |
| 2008/0013361 A1* | 1/2008 | Miyakawa | ......... | G11C 7/18 |
| | | | | 365/145 |
| 2008/0049508 A1* | 2/2008 | Iwai | ............... | G11C 16/3427 |
| | | | | 365/185.17 |
| 2008/0089135 A1* | 4/2008 | Ito | ............... | G11C 16/3445 |
| | | | | 365/185.29 |
| 2008/0212388 A1* | 9/2008 | Hoefler | ............ | G11C 17/18 |
| | | | | 365/225.7 |
| 2008/0232173 A1* | 9/2008 | Chen | ............... | G11C 8/08 |
| | | | | 365/185.23 |
| 2008/0316839 A1* | 12/2008 | Kajigaya | ............ | G11C 11/4085 |
| | | | | 365/189.11 |
| 2009/0039335 A1* | 2/2009 | Terao | ............... | H01L 45/141 |
| | | | | 257/4 |
| 2009/0273978 A1* | 11/2009 | Fukuda | ............ | G11C 16/3404 |
| | | | | 365/185.17 |
| 2010/0039858 A1* | 2/2010 | Maccarrone | ...... | G11C 16/0483 |
| | | | | 365/185.03 |
| 2011/0255336 A1* | 10/2011 | Futatsuyama | ..... | G11C 16/3436 |
| | | | | 365/185.03 |
| 2013/0064013 A1* | 3/2013 | Lee | ............... | G11C 11/5628 |
| | | | | 365/185.03 |
| 2013/0294155 A1* | 11/2013 | Chen | ............... | G11C 16/26 |
| | | | | 365/185.02 |
| 2015/0071008 A1* | 3/2015 | Yang | ............... | G11C 16/3427 |
| | | | | 365/185.23 |
| 2015/0221351 A1 | 8/2015 | Park et al. | | |
| 2015/0364558 A1* | 12/2015 | Wu | ............... | H01L 29/41725 |
| | | | | 257/316 |
| 2018/0277218 A1 | 9/2018 | Shimizu et al. | | |
| 2019/0088333 A1* | 3/2019 | Shirakawa | ............ | G11C 16/08 |
| 2019/0088335 A1* | 3/2019 | Hsiung | ............ | H01L 27/11556 |
| 2019/0180824 A1* | 6/2019 | Hsu | ............... | G11C 16/16 |
| 2019/0198111 A1* | 6/2019 | Higashi | ............ | G11C 16/10 |
| 2019/0318784 A1* | 10/2019 | Lee | ............... | G11C 11/5642 |
| 2019/0333581 A1* | 10/2019 | Diep | ............... | H01L 27/11582 |
| 2019/0348131 A1* | 11/2019 | Watanabe | ......... | H01L 27/11573 |
| 2019/0362799 A1* | 11/2019 | Yang | ............... | G11C 16/3459 |
| 2020/0005878 A1* | 1/2020 | Lu | ............... | G11C 11/5671 |
| 2020/0202962 A1* | 6/2020 | Chen | ............... | G11C 16/3427 |

\* cited by examiner

SEMICONDUCTOR STORAGE DEVICE

CROSS-REFERENCE TO RELATED APPLICATION(S)

This application is based upon and claims the benefit of priority from Japanese Patent Application No. 2019-099649, filed May 28, 2019, the entire contents of which are incorporated herein by reference.

FIELD

Embodiments described herein relate generally to a semiconductor storage device.

BACKGROUND

A NAND-type flash memory is known as a type of semiconductor storage device. A NAND-type flash memory including a plurality of memory cells stacked three-dimensionally is known.

DETAILED DESCRIPTION

Figure 1:
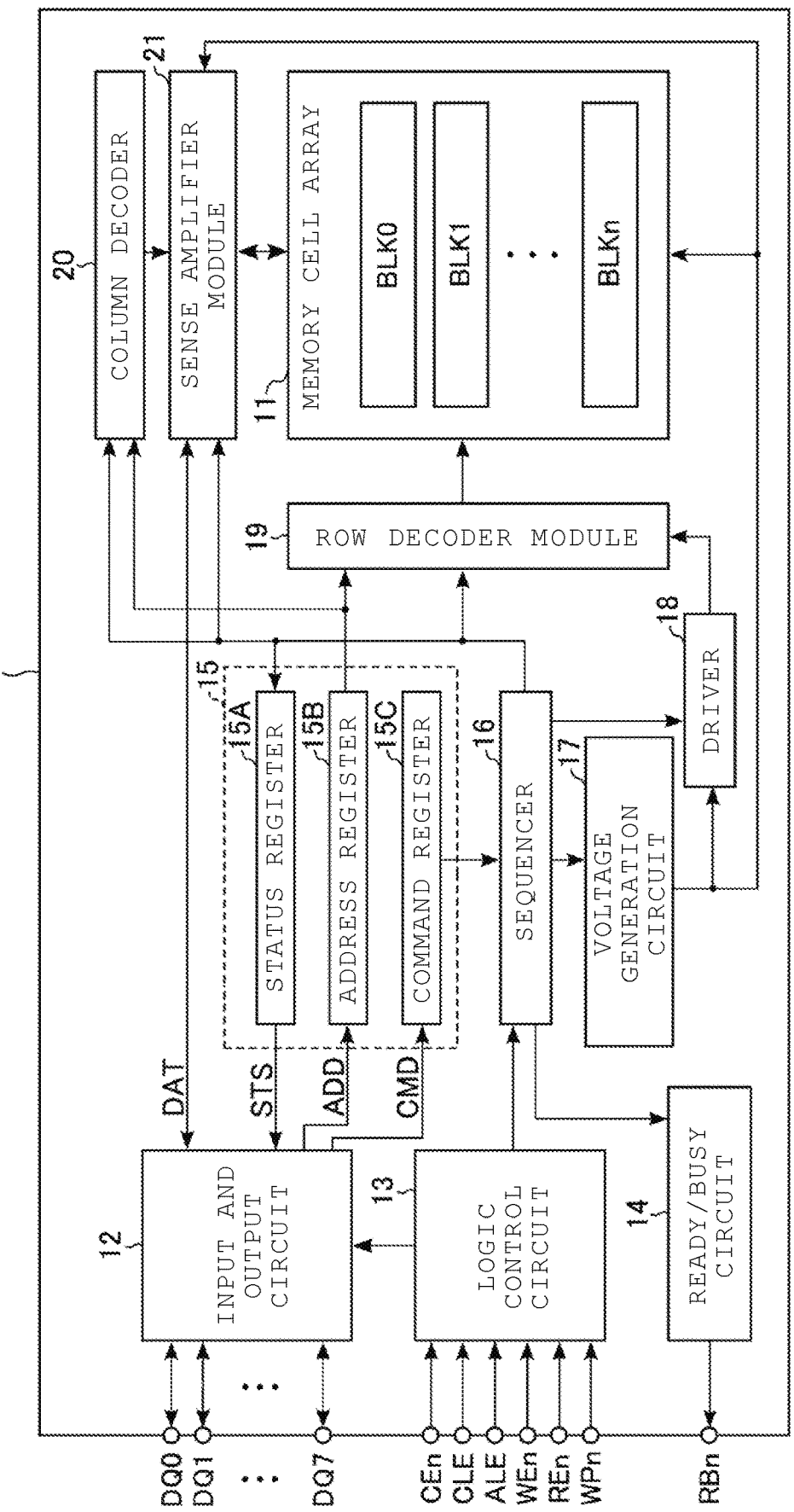
FIG. 1 is a block diagram of a NAND-type flash memory according to a first embodiment.

Embodiments provide a semiconductor storage device capable of improving read performance.

In general, according to one embodiment, a semiconductor storage device includes a plurality of memory cells which are connected to each other in series, a plurality of word lines which are respectively connected to gates of the plurality of memory cells, and a control circuit configured to perform a read operation by applying a first voltage higher than ground voltage to the plurality of word lines during a first time period at the beginning of which each of the word lines is at ground voltage, applying a second voltage lower than the first voltage to a first word line during a second time period subsequent to the first time period, applying a third voltage higher than the second voltage to the first word line during a third time period subsequent to the second time period, and determining data of the memory cells connected to the first word line while all portions of the first word line are at the third voltage.

Hereinafter, embodiments will be described with reference to the accompanying drawings. Some embodiments described below are given as examples of devices and methods for embodying the technical idea of the present disclosure, and the technical idea of the present disclosure is not limited to the shapes, structures, arrangement, and the like of components described in the examples. Each functional block may be implemented as hardware, software, or a combination thereof. It is not essential that each functional block is associated with a distinct function in the following examples. For example, some functions may be executed by functional blocks different from the illustrated functional blocks. The illustrated functional block may be divided into smaller functional sub-blocks. Meanwhile, in the following description, elements having the same function and configuration are denoted by the same reference numeral, and a repeated description will be given only when necessary.

[1] First Embodiment

[1-1] Configuration of NAND-type Flash Memory 10

A semiconductor storage device of the present embodiment is a NAND-type flash memory 10. FIG. 1 is a block diagram of the NAND-type flash memory 10 according to a first embodiment.

The NAND-type flash memory 10 includes a memory cell array 11, an input and output circuit 12, a logic control circuit 13, a ready/busy circuit 14, a register group 15 (including a status register 15A, an address register 15B, and a command register 15C), a sequencer (also referred to as a control circuit) 16, a voltage generation circuit 17, a driver 18, a row decoder module 19, a column decoder 20, a sense amplifier module 21, and the like.

The memory cell array 11 includes a plurality of blocks BLk0 to BLKn. Here, n is an integer of 1 or greater. Each of the plurality of blocks BLK includes a plurality of memory cell transistors. In the specification, the memory cell transistor may also be referred to as a memory cell or a cell. The memory cell transistor includes an electrically rewritable memory cell. In the memory cell array 11, a plurality of bit lines, a plurality of word lines, a source line, and the like are provided to control a voltage to be applied to the memory cell transistor. A specific configuration of the block BLK will be described later.

The input and output circuit 12 and the logic control circuit 13 are connected to an external device (for example, a memory controller) through a bus. The input and output circuit 12 transmits and receives signals DQ (for example, DQ0 to DQ7) through the bus between the input and output circuit and the memory controller.

The logic control circuit 13 receives external control signals (for example, a chip enable signal CEn, a command latch enable signal CLE, an address latch enable signal ALE, a write enable signal WEn, a read enable signal REn, and a write protect signal WPn) from the memory controller through the bus. Here, "n" attached to the name of the signal indicates that it is active when low.

The signal CEn enables selection of the NAND-type flash memory 10 and is asserted when the NAND-type flash memory 10 is selected. The signal CLE enables a command transmitted as the signal DQ to be latched to a command register. The signal ALE enables an address transmitted as the signal DQ to be latched to an address register. The signal WEn enables data to be input to the NAND-type flash memory 10 through a DQ line. The signal REn enables data to be output from the NAND-type flash memory 10 through the DQ line. The signal WPn is asserted when writing and erasing in the NAND-type flash memory 10 are prohibited.

The ready/busy circuit 14 generates a ready/busy signal RBn under the control of the sequencer 16. The signal RBn indicates whether the NAND-type flash memory 10 is in a ready state (a state where a command can be received from the outside) or a busy state (a state where a command cannot be received from the outside). The memory controller can know the state of the NAND-type flash memory 10 by receiving the signal RBn from the NAND-type flash memory 10.

The status register 15A stores status information STS required for the operation of the NAND-type flash memory 10 and transfers the status information STS to the input and output circuit 12 based on an instruction of the sequencer 16. The address register 15B stores address information ADD transferred from the input and output circuit 12. The address information ADD includes a column address and a row address. The row address includes, for example, a block address. The command register 15C stores a command CMD transferred from the input and output circuit 12. The status register 15A, the address register 15B, and the command register 15C include, for example, an SRAM.

The sequencer 16 receives a command from the command register 15C and controls the NAND-type flash memory 10 according to a sequence based on the command. For example, the sequencer 16 controls the row decoder module 19, the sense amplifier module 21, the voltage generation circuit 17, and the like so as to execute a write operation, a read operation, and an erasing operation.

The voltage generation circuit 17 receives a power voltage from the outside of the NAND-type flash memory 10 and generates a plurality of voltages required for a write operation, a read operation, and an erasing operation by using the power voltage. The voltage generation circuit 17 supplies the generated voltages to the memory cell array 11, the driver 18, the sense amplifier module 21, and the like.

The driver 18 receives a plurality of voltages from the voltage generation circuit 17. The driver 18 supplies a plurality of voltages selected from among the plurality of voltages supplied from the voltage generation circuit 17 according to a read operation, a write operation, and an erasing operation to the row decoder module 19 through a plurality of signal lines.

The row decoder module 19 receives a row address from the address register 15B and decodes the row address. The row decoder module 19 selects a block BLK based on the decoded row address. The row decoder module 19 transfers the plurality of voltages supplied from the driver 18 to the selected block BLK.

The column decoder 20 receives a column address from the address register 15B and decodes the column address. The column decoder 20 performs a bit line selection operation based on the decoded column address.

The sense amplifier module 21 detects and amplifies data read from the memory cell transistor to the bit lines during a read operation. The sense amplifier module 21 temporarily stores the read data read from the memory cell transistor and transfers the read data to the input and output circuit 12. The sense amplifier module 21 temporarily stores write data transferred from the input and output circuit 12 during a write operation. The sense amplifier module 21 transfers the write data to the bit lines.

[1-2] Circuit Configuration of Memory Cell Array 11

Figure 2:
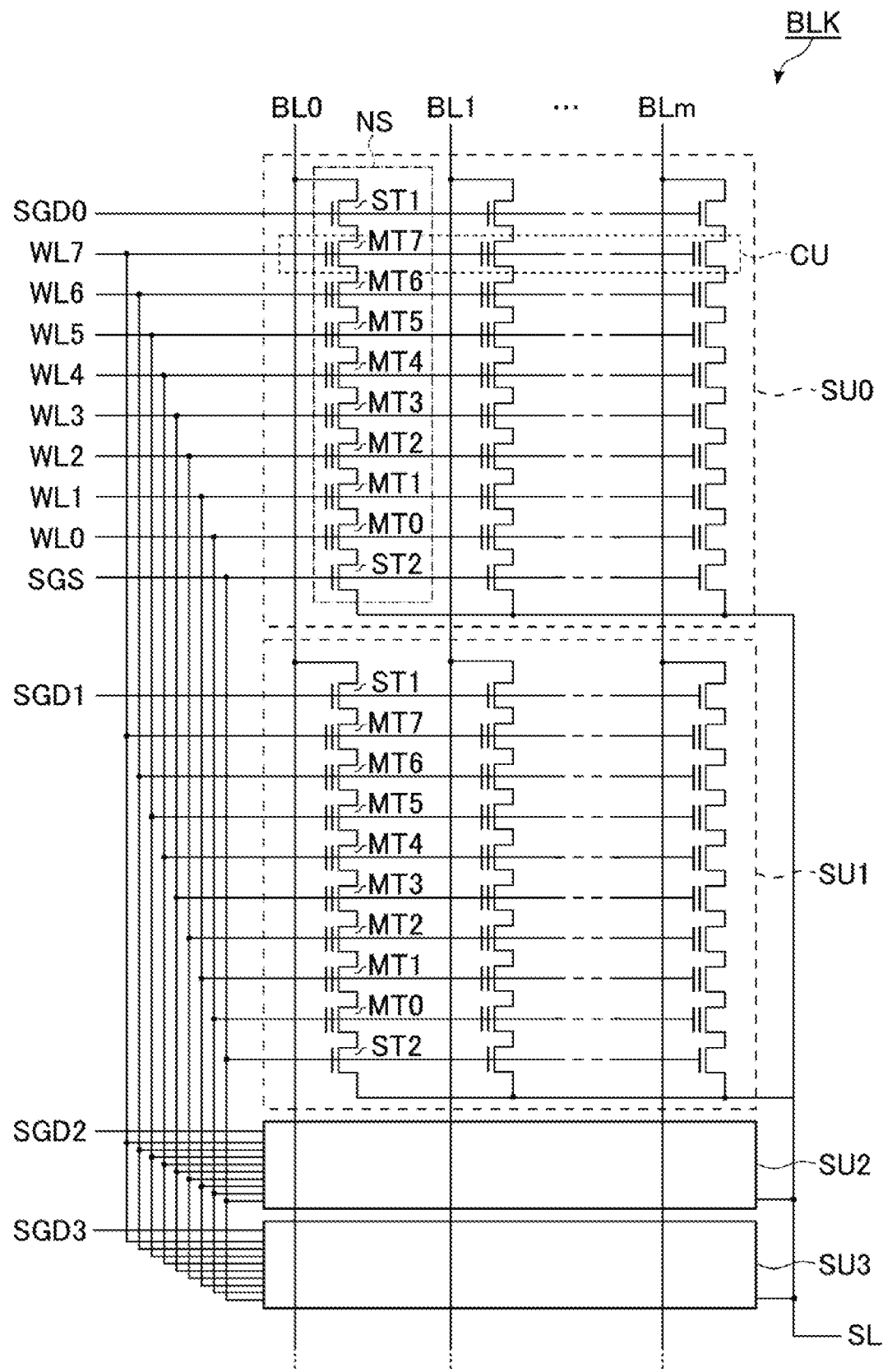
FIG. 2 is a circuit diagram of one block in a memory cell array illustrated in FIG. 1.

Next, a circuit configuration of the memory cell array 11 will be described. FIG. 2 is a circuit diagram of one block BLK in the memory cell array 11 illustrated in FIG. 1.

Each of the plurality of blocks BLK includes a plurality of string units SU. FIG. 2 illustrates four string units SU0 to SU3. The number of string units SU in one block BLK may be set as desired.

Each of the plurality of string units SU includes a plurality of NAND strings (more generally referred to as memory strings) NS. The number of NAND strings NS in one string unit SU may be set as desired.

Each of the plurality of NAND strings NS includes a plurality of memory cell transistors MT and select transistors ST1 and ST2. The plurality of memory cell transistors MT are connected in series between a source of the select transistor ST1 and a drain of the select transistor ST2. FIG. 2 illustrates a configuration example in which the NAND string NS includes eight memory cell transistors MT (MT0 to MT7) for simplification, but the number of memory cell transistors MT in the NAND string NS is larger than eight and may be set as desired.

The memory cell transistor MT includes a control gate electrode and a charge storage layer and stores data in a non-volatile manner. The memory cell transistor MT may store 1-bit data or data of 2 bits or more. The select transistors ST1 and ST2 are used to select the string unit SU in various operations.

Gates of a plurality of select transistors ST1 in the string unit SU0 are connected to a select gate line SGD0 in common, and similarly, select gate lines SGD1 to SGD3 are respectively connected to the string units SU1 to SU3. Gates of a plurality of select transistors ST2 in the string unit SU0 are connected to a select gate line SGS in common. Similarly, the select gate line SGS is connected to each of the string units SU1 to SU3. Meanwhile, individual select gate lines SGS, that is, select gate lines SGS0 to SGS3 may be respectively connected to string units SU0 to SU3 in each block BLK.

Control gates of memory cell transistors MT0 to MT7 in each block BLK are connected to word lines WL0 to WL7.

Drains of select transistors ST1 of a plurality of NAND strings NS in the same column, among NAND strings NS arranged in a matrix configuration in each block BLK, are connected to any one of a plurality of bit lines BL0 to BLm in common. Here, "m" is an integer of 1 or greater. Each bit line BL is connected to a plurality of blocks BLK in common and is connected to one NAND string NS in each string unit SU in each block BLK. Sources of a plurality of select transistors ST2 in each block BLK are connected to a source line SL in common. The source line SL is connected to, for example, a plurality of blocks BLK in common.

For example, pieces of data of a plurality of memory cell transistors MT in each block BLK are collectively erased. Reading and writing are collectively performed on a plurality of memory cell transistors MT connected to one word line WL in common which is disposed in one string unit SU. A set of memory cell transistors MT sharing a word line WL in one string unit SU is referred to as a cell unit CU. A group of 1-bit data stored in each of a plurality of memory cell transistors MT in the cell unit CU is referred to as a page.

That is, a write operation and a read operation for the cell unit CU are performed with a page as a unit.

[1-3] Threshold Voltage Distribution of Memory Cell Transistor MT

Figure 3:
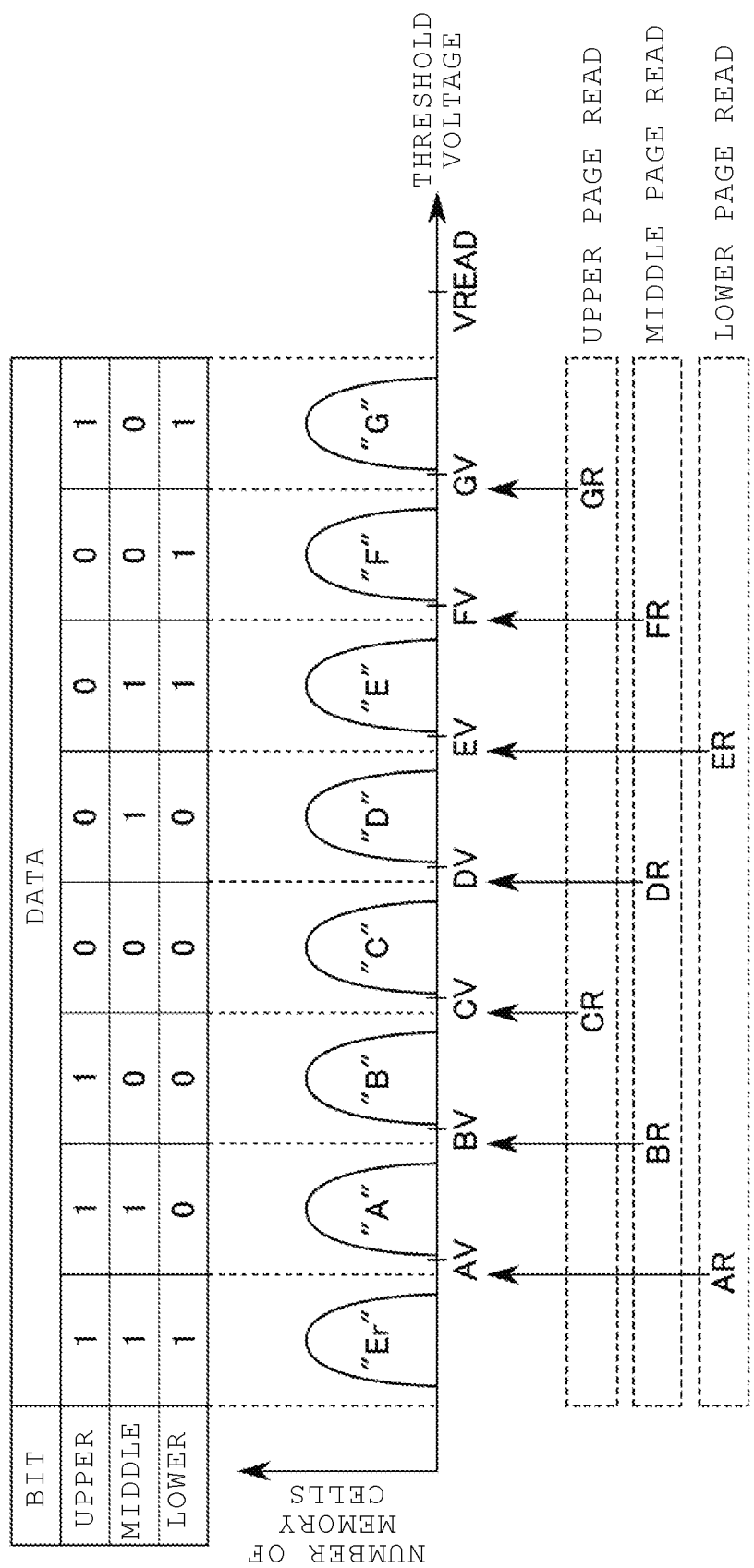
FIG. 3 is a schematic diagram illustrating an example of a threshold voltage distribution of a memory cell transistor.

Next, a distribution of threshold voltages Vth capable of being set in the memory cell transistor MT will be described. FIG. 3 is a schematic diagram illustrating an example of a threshold voltage distribution of the memory cell transistor MT. The memory cell transistor MT may be programmed to store data of 1 bit, 2 bits, or more. In the present embodiment, the memory cell transistor MT is programmed to stored data of 3 bits using a so-called triple level cell (TLC) method.

The 3-bit data is defined by a lower bit, a middle bit, and an upper bit. In the case where the memory cell transistor MT stores 3 bits, the memory cell transistor MT may be set to any one of eight states based on a plurality of threshold voltages. The eight states are referred to as states "Er", "A", "B", "C", "D", "E", "F", and "G" in order from the lowest one. A plurality of memory cell transistors MT belonging to each of the states "Er", "A", "B", "C", "D", "E", "F", and "G" form a distribution.

For example, data value "111", data value "110", data value "100", data value "000", data value "010", data value "011", data value "001", and data value "101" are assigned to the states "Er", "A", "B", "C", "D", "E", "F", and "G". When a lower bit, a middle bit, and an upper bit are assumed to be "X", "Y", and "Z", respectively, the arrangement of bits is "Z, Y, X". Assignment of a threshold voltage distribution to a particular data value may be set as desired.

In order to read data stored in a memory cell transistor MT to be read, a state to which a threshold voltage of the memory cell transistor MT belongs is determined. In order to determine a state, read voltages AR, BR, CR, DR, ER, FR, and GR are used, and the read voltages AR, BR, CR, DR, ER, FR, and GR become higher in this order.

The state "Er" is equivalent to, for example, a state where data is erased (erased state). A threshold voltage of the memory cell transistor MT which belongs to the state "Er" is lower than the voltage AR and has, for example, a negative value.

The states "A" to "G" are equivalent to state where a charge is injected into a charge storage layer to write data in the memory cell transistor MT, and threshold voltages of the memory cell transistor MT which belong to the states "A" to "G" have, for example, positive values. A threshold voltage of the memory cell transistor MT which belongs to the state "A" is higher than the read voltage AR and is equal to or less than the read voltage BR. A threshold voltage of the memory cell transistor MT which belongs to the state "B" is higher than the read voltage BR and is equal to or less than the read voltage CR. A threshold voltage of the memory cell transistor MT which belongs to the state "C" is higher than the read voltage CR and is equal to or less than the read voltage DR. A threshold voltage of the memory cell transistor MT which belongs to the state "D" is higher than the read voltage DR and is equal to or less than the read voltage ER. A threshold voltage of the memory cell transistor MT which belongs to the state "E" is higher than the read voltage ER and is equal to or less than the read voltage FR. A threshold voltage of the memory cell transistor MT which belongs to the state "F" is higher than the read voltage FR and is equal to or less than the read voltage GR. A threshold voltage of the memory cell transistor MT which belongs to the state "G" is higher than the read voltage GR and is lower than a voltage VREAD.

The voltage VREAD is a voltage to be applied to a word line WL connected to a memory cell transistor MT of a cell unit CU which is not to be read, and is higher than a threshold voltage of a memory cell transistor MT in any state. That is, a memory cell transistor MT having a control gate to which the voltage VREAD is applied is set to be in an on state, regardless of data stored therein.

A verification voltage used in a write operation is set between adjacent threshold voltage distributions. Specifically, verification voltages AV, BV, CV, DV, EV, FV, and GV are respectively set in response to the states "A", "B", "C", "D", "E", "F", and "G". For example, the verification voltages AV, BV, CV, DV, EV, FV, and GV are respectively set to be slightly higher than the read voltages AR, BR, CR, DR, ER, FR, and GR.

As described above, each memory cell transistor MT may be set to any one of the eight states and store 3-bit data. Writing and reading are performed in units of pages in one cell unit CU. In the case where the memory cell transistor MT stores 3-bit data, a lower bit, a middle bit, and an upper bit are respectively assigned to three pages in one cell unit CU. Pages collectively written or read for a lower bit, a middle bit, and an upper bit are referred to as a lower page, a middle page, and an upper page, respectively.

When the above-described data assignment is employed, a lower page is determined by a read operation using the read voltages AR and ER. A middle page is determined by a read operation using the read voltages BR, DR, and FR. An upper page is determined by a read operation using the read voltages CR and GR.

[1-4] Configuration of Sense Amplifier Module 21

Figure 4:
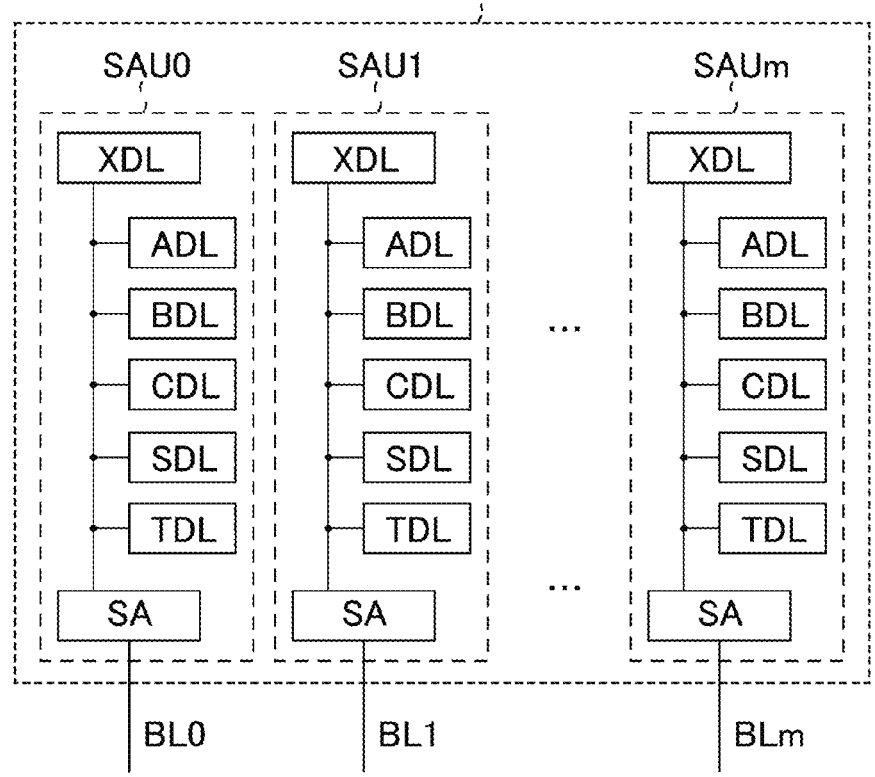
FIG. 4 is a block diagram of a sense amplifier module illustrated in FIG. 1.

FIG. 4 is a block diagram of the sense amplifier module 21 illustrated in FIG. 1.

The sense amplifier module 21 includes sense amplifier units SAU0 to SAUm corresponding to the bit lines BL0 to BLm. Each sense amplifier unit SAU includes a sense amplifier SA and data latch circuits ADL, BDL, CDL, SDL, TDL, and XDL. The sense amplifier SA and the data latch circuits ADL, BDL, CDL, SDL, TDL, and XDL are connected so as to be capable of transferring data to each other.

The data latch circuits ADL, BDL, CDL, SDL, and TDL temporarily store data. During a write operation, the sense amplifier SA controls a voltage of a bit line BL according to data stored in the data latch circuit SDL. The data latch circuit TDL is used for data computation in the sense amplifier module 21. The data latch circuits ADL, BDL, and CDL are used for a multi-value operation in which the memory cell transistor MT stores data of 2 bits or more. That is, the data latch circuit ADL is used to store a lower page. The data latch circuit BDL is used to store a middle page. The data latch circuit CDL is used to store an upper page. The number of data latch circuits in the sense amplifier unit SAU may be set as desired according to the number of bits stored in one memory cell transistor MT.

The data latch circuit XDL temporarily stores data. The data latch circuit XDL is connected to the input and output circuit 12. The data latch circuit XDL temporarily stores write data transmitted from the input and output circuit 12 and temporarily stores read data transmitted from the data latch circuit SDL and the like. More specifically, data transfer between the input and output circuit 12 and the sense amplifier module 21 is performed through the data latch circuit XDL for one page. Write data received by the input and output circuit 12 is transferred to any one of the data latch circuits ADL, BDL, and CDL through the data latch circuit XDL. Read data read by the sense amplifier SA is transferred to the input and output circuit 12 through the data latch circuit XDL. A set of the data latch circuits XDL is also referred to as a data cache.

The sense amplifier SA detects data read to a corresponding bit line BL during a read operation and determines which one of data "0" and data "1" the data is. The sense amplifier SA applies a voltage to a bit line BL based on write data during a write operation.

(Specific Configuration Example of Sense Amplifier Unit SAU)

Figure 5:
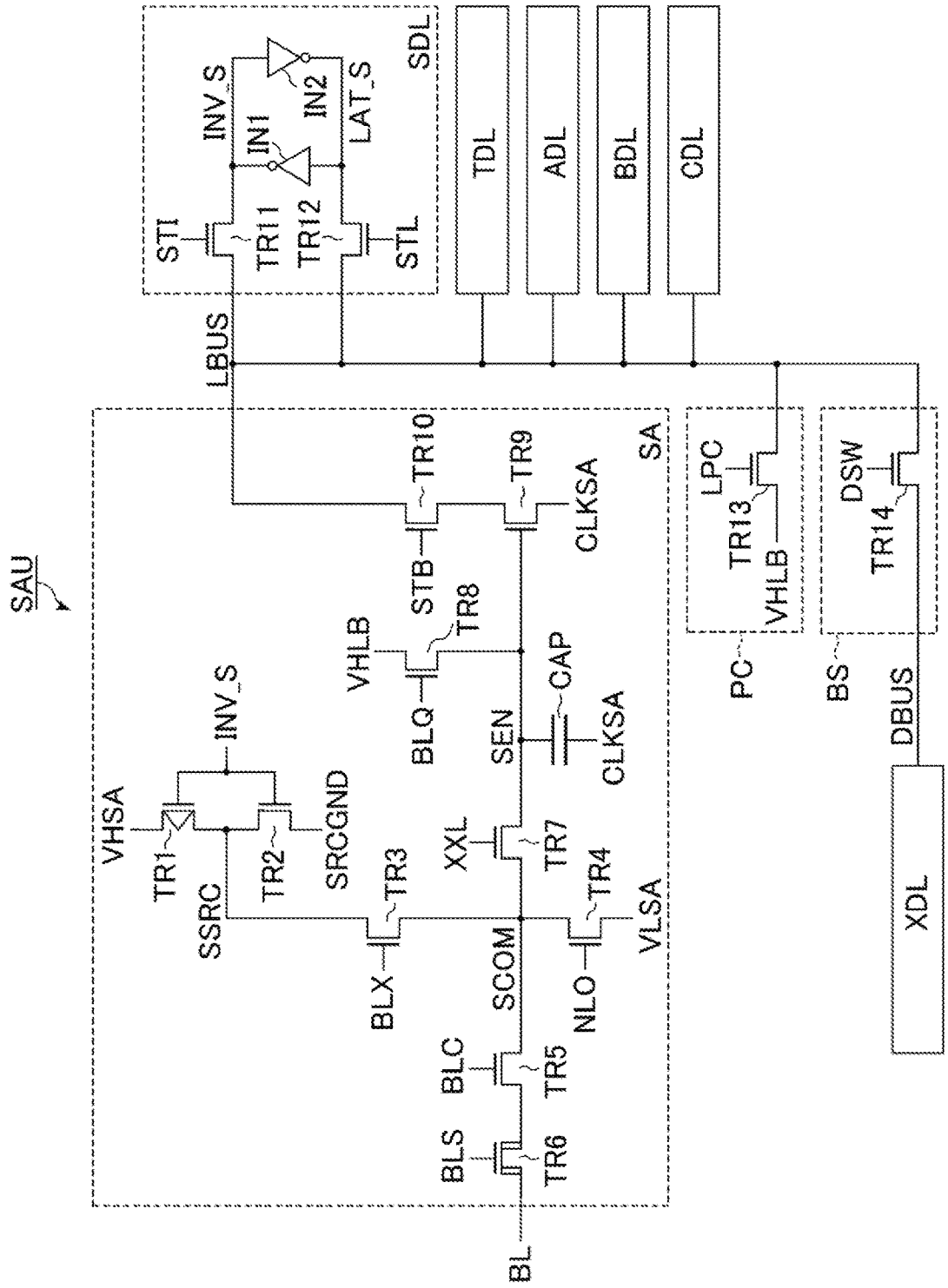
FIG. 5 is a circuit diagram of one sense amplifier unit.

Next, a specific configuration example of the sense amplifier unit SAU will be described. FIG. 5 is a circuit diagram of one sense amplifier unit SAU. A plurality of signals to be supplied to the sense amplifier unit SAU are generated by the sequencer 16.

The sense amplifier SA includes, for example, a p-channel MOS transistor TR1, n-channel MOS transistors TR2 to TR14, and a capacitor CAP.

A source of the transistor TR1 is connected to a power terminal to which a voltage VHSA is supplied, a drain thereof is connected to a node SSRC, and a gate thereof is connected to a node INV_S in the data latch circuit SDL.

A drain of the transistor TR2 is connected to the node SSRC, a source thereof is connected to a power terminal to which a voltage SRCGND is supplied, and a gate thereof is connected to a node INV_S. The voltage SRCGND is, for example, a ground voltage VSS.

A drain of the transistor TR3 is connected to the node SSRC, a source thereof is connected to a node SCOM, and a signal BLX is input to a gate thereof.

A drain of the transistor TR4 is connected to the node SCOM, a source thereof is connected to a power terminal to which a voltage VLSA is supplied, and a signal NL0 is input to a gate thereof. The voltage VLSA is, for example, a ground voltage VSS.

A drain of the transistor TR5 is connected to the node SCOM, and a signal BLC is input to a gate thereof. A drain of the transistor TR6 is connected to the source of the transistor TR5, a source thereof is connected to a corresponding bit line BL, and a signal BLS is input to a gate thereof. The transistor TR6 is a high breakdown voltage MOS transistor.

A drain of the transistor TR7 is connected to a node SEN, a source thereof is connected to the node SCOM, and a signal XXL is input to a gate thereof.

One electrode of the capacitor CAP is connected to the node SEN, and the other electrode of the capacitor CAP is supplied with a clock signal CLKSA. For example, the clock signal CLKSA may be increased from the ground voltage VSS to assist a current flowing from the node SEN toward the bit line BL during a sense operation, or may be maintained at the ground voltage VSS.

A drain of the transistor TR8 is connected to a power terminal to which a voltage VHLB is supplied, a source thereof is connected to the node SEN, and a signal BLQ is input to a gate thereof. The transistor TR8 precharges the node SEN by transferring the voltage VHLB to the node SEN.

A source of the transistor TR9 is supplied with the clock signal CLKSA, and a gate is connected to the node SEN. A drain of the transistor TR10 is connected to a bus LBUS, a source thereof is connected to the drain of the transistor TR9, and a signal STB is input to a gate thereof. The signal STB controls a timing when data read to a bit line BL is determined.

The data latch circuit SDL includes inverter circuits IN1 and IN2 and n-channel MOS transistors TR11 and TR12. An input terminal of the inverter circuit IN1 is connected to a node LAT_S, and an output terminal thereof is connected to a node INV_S. An input terminal of the inverter circuit IN2 is connected to the node INV_S, and an output terminal thereof is connected to the node LAT_S. One end of the transistor TR11 is connected to the node INV_S, the other end is connected to the bus LBUS, and a signal STI is input to a gate thereof. One end of the transistor TR12 is connected to the node LAT_S, the other end is connected to the bus LBUS, and a signal STL is input to a gate thereof. For example, data stored in the node LAT_S is equivalent to data stored in the data latch circuit SDL, and data stored in the node INV_S is equivalent to inverted data of data stored in the node LAT_S. Circuit configurations of the data latch circuits ADL, BDL, CDL, TDL, and XDL are similar to the circuit configuration of the data latch circuit SDL, and thus description thereof will be omitted.

The sense amplifier unit SAU further includes a precharge circuit PC and a bus switch BS.

The precharge circuit PC precharges the bus LBUS. The precharge circuit PC includes, for example, the n-channel MOS transistor TR13. A drain of the transistor TR13 is connected to the bus LBUS, a source thereof is connected to a power terminal to which the voltage VHLB is supplied, and a signal LPC is input to a gate thereof. The precharge circuit PC precharges the bus LBUS by transferring the voltage VHLB to the bus LBUS.

The bus switch BS connects the bus LBUS and a bus DBUS. The bus LBUS is connected to the data latch circuit XDL. The bus switch BS includes, for example, the n-channel MOS transistor TR14. One end of the transistor TR14 is connected to the bus LBUS, the other end is connected to the bus DBUS, and a signal DSW is input to a gate thereof.

[1-5] Configuration of Row Decoder Module 19

Figure 6:
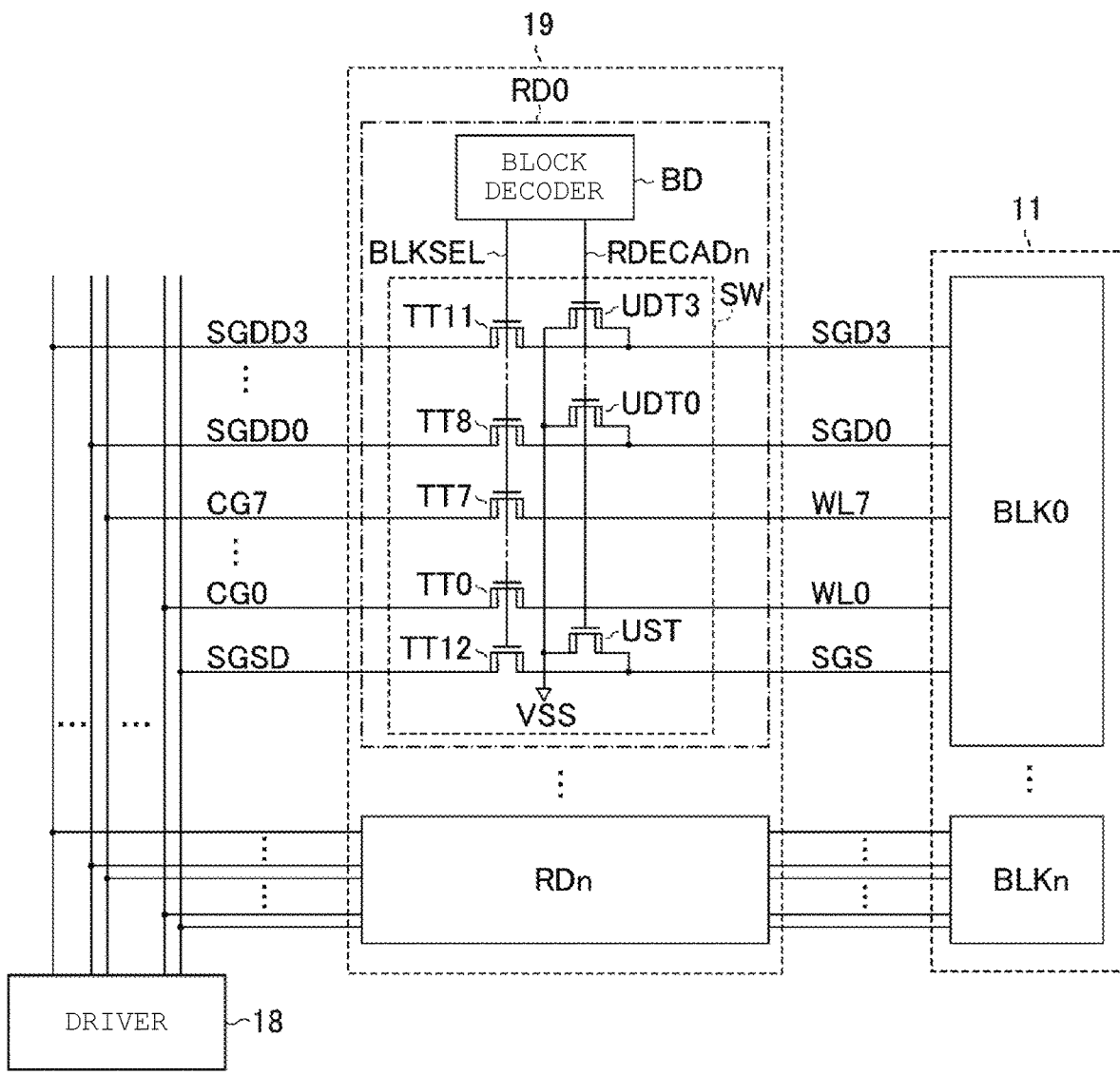
FIG. 6 is a block diagram of a row decoder module illustrated in FIG. 1.

FIG. 6 is a block diagram of the row decoder module 19 illustrated in FIG. 1. The row decoder module 19 includes a plurality of row decoders RD (RD0 to RDn). The row decoders RD0 to RDn are provided so as to correspond to the blocks BLk0 to BLKn.

Each of the row decoders RD includes a block decoder BD and a transfer switch group SW. The transfer switch group SW includes n-channel MOS transistors TT0 to TT12, UDT0 to UDT3, and UST. The transistors TT0 to TT12, UDT0 to UDT3, and UST are each a high breakdown voltage transistor.

The block decoder BD decodes a block address received from the address register 15B. As a result of the decoding, when it is determined that the block BLK corresponding to the block decoder BD is a selected block BLK, the block decoder BD outputs a high-level signal BLKSEL and a low-level signal RDECADn. When it is determined that the corresponding block BLK is not a selected block BLK, the block decoder BD outputs a low-level signal BLKSEL and a high-level signal RDECADn.

The signal BLKSEL is input to gates of the transistors TT0 to TT11. Drains of the transistors TT0 to TT7 are respectively connected to signal lines CG0 to CG7, and sources of the transistors TT0 to TT7 are respectively connected to the word lines WL0 to WL7. Drains of the transistors TT8 to TT11 are respectively connected to the signal lines SGDD0 to SGDD3, and sources of the transistors TT8 to TT11 are respectively connected to the select gate lines SGD0 to SGD3. A drain of the transistor TT12 is connected to a signal line SGSD, and a source thereof is connected to the select gate line SGS.

The signal RDECADn is input to gates of the transistors UDT0 to UDT3 and UST. Drains of the transistors UDT0 to UDT3 are respectively connected to the select gate lines SGD0 to SGD3, and sources of the transistors UDT0 to UDT3 are connected to a ground terminal to which the ground voltage VSS is applied. A drain of the transistor UST is connected to the select gate line SGS, and a source thereof is connected to the ground terminal to which the ground voltage VSS is applied.

Therefore, for example, in a transfer switch group SW corresponding to the selected block BLK, the transistors TT0 to TT12 are set to be in an on state, and transistors UDT0 to UDT3 and UST are set to be in an on off state. Thereby, the word lines WL0 to WL7 are respectively connected to the signal lines CG0 to CG7, the select gate lines SGD0 to SGD3 are respectively connected to the signal lines SGDD0 to SGDD3, and the select gate line SGS is connected to the signal line SGSD.

On the other hand, in a transfer switch group SW corresponding to a non-selected block BLK, the transistors TT0 to TT12 are set to be in an off state, and the transistors UDT0 to UDT3 and UST are set to be in an on state. Thereby, the word lines WL are separated from the signal lines CG, and the select gate lines SGD and SGS are respectively separated from the signal lines SGDD and SGSD.

The driver 18 supplies a voltage to the signal lines CG, SGDD, and SGSD according to an address received from the address register 15B. A voltage to be supplied from the driver 18 is transferred to the word lines WL and the select gate lines SGD and SGS in the selected block BLK through the transistors TT0 to TT12 in the transfer switch group SW corresponding to the selected block BLK.

Figure 7:
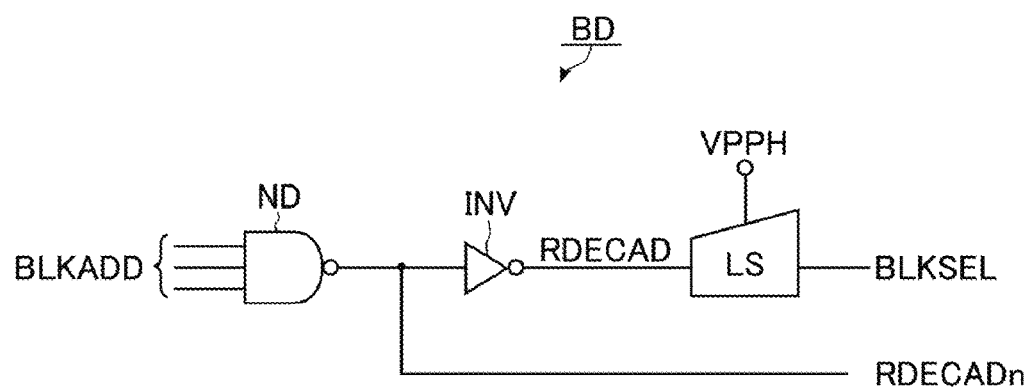
FIG. 7 is a circuit diagram of a block decoder illustrated in FIG. 6.

Next, an example of a configuration of the block decoder BD in the row decoder RD will be described. FIG. 7 is a circuit diagram of the block decoder BD illustrated in FIG. 6. The block decoder BD includes a NAND gate ND, an inverter circuit INV, and a level shifter LS.

A block address BLKADD is input to an input terminal of the NAND gate ND from the address register 15B. In the block address BLKADD, all bits are set to be in a high level in a selected block, and at least one bit is set to be in a low level in a non-selected block. The NAND gate ND outputs the signal RDECADn.

An input terminal of the inverter circuit INV is connected to an output terminal of the NAND gate ND. The inverter circuit INV outputs a signal RDECAD. The signal RDECAD is input to the level shifter LS.

The level shifter LS receives a stepped-up voltage VPPH. The level shifter LS steps up the voltage of the signal RDECAD with the stepped-up voltage VPPH as a target voltage. The level shifter LS outputs a signal BLKSEL as a result of the step-up.

With the above-described configuration, the block decoder BD can output the signal BLKSEL and the signal RDECADn having different logic levels to the transfer switch group SW.

[1-6] Read Operation

A read operation of the NAND-type flash memory 10 configured as described above will be described.

When a potential difference between channels of adjacent two memory cell transistors included in one NAND string is increased, an inter-band tunnel current may be generated. When the inter-band tunnel current is generated, hot carriers are generated, and a charge may be injected into the charge storage layer. In such situations, threshold voltages of the memory cell transistors fluctuate, and fail bits are increased in a read operation.

In the present embodiment, a plurality of memory cell transistors in a NAND string are turned on in a first period of a read operation to form a channel in the memory cell transistors. Thereby, a difference in potential is reduced between adjacent memory cell transistors.

Figure 8:
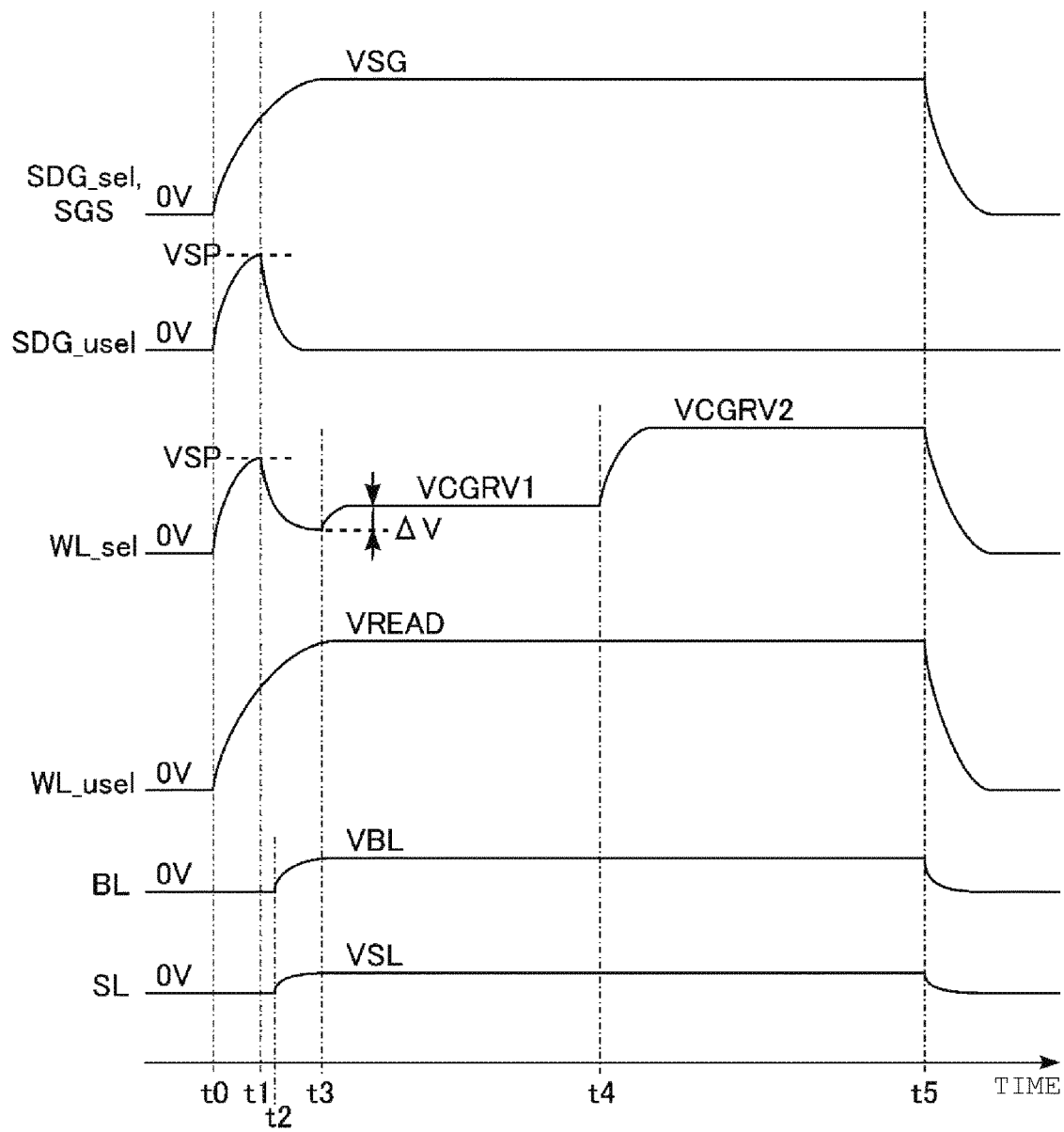
FIG. 8 is a timing diagram illustrating a read operation of the NAND-type flash memory according to the first embodiment.

FIG. 8 is a timing diagram illustrating a read operation of the NAND-type flash memory 10. In the drawings and specification, a selected word line is denoted by "WL_sel", a non-selected word line is denoted by "WL_usel", a select gate line SGD which is selected is denoted by "SGD_sel", and a select gate line SGD which is not selected is denoted by "SGD_usel". The selected word line refers to one word line to be read among a plurality of word lines disposed in a block BLK, and the non-selected word line refers to any of a plurality of word lines other than the selected word line. The select gate line SGD which is selected refers to a select gate line SGD which is disposed in a string unit SU to be read among a plurality of select gate lines SGD disposed in a block BLK, and the select gate line SGD which is not selected refers to any of the plurality of select gate lines SGD other than the select gate line SGD which is selected.

At time t0, the row decoder module 19 starts to step up a select gate line SGD_sel, a select gate line SGD_usel, a select gate line SGS, a selected word line WL_sel, and a non-selected word line WL_usel.

At time t1, the select gate line SGD_sel, the select gate line SGD_usel, the selected word line WL_sel, and the non-selected word line WL_usel are stepped up to a voltage VSP. Thereby, all transistors in each NAND string are turned on. In each NAND string, a channel is formed in a plurality of memory cell transistors, and a difference in potential between adjacent memory cell transistors is reduced.

The voltage VSP is a voltage for turning on a memory cell transistor and is set to equal to or less than the voltage VREAD. For example, the voltage VSP is set to be lower than the voltage VREAD by a predetermined voltage. Specifically, when a minimum potential difference for causing an inter-band tunnel current between adjacent memory cell transistors is set to be $V\_btbt$, the voltage VSP is set to satisfy a relationship of $(VREAD-VSP) < V\_btbt$.

After time t1, the row decoder module 19 steps down the selected word line WL_sel and the select gate line SGD_usel. The select gate line SGD_usel is set to 0 V.

At time t2, the sense amplifier module 21 applies a voltage VBL to a bit line BL. The sequencer 16 applies a voltage VSL to a source line SL. The voltage VBL is set to be higher than the ground voltage VSS. The voltage VSL is set to be equal to or higher than the ground voltage VSS and lower than the voltage VBL.

A first read voltage in the read operation is set to be "VCGRV1". The read voltage VCGRV1 corresponds to any one of the plurality of read voltages shown in FIG. 3. After time t2, the potential of the selected word line WL_sel is lowered to "VCGRV1-$\Delta$V".

The voltage "VCGRV1-$\Delta$V" is set to be higher than 0 V and lower than the read voltage VCGRV1. The potential $\Delta$V is, for example, approximately 0.5 V. The potential "VCGRV1-$\Delta$V" is, for example, a positive voltage. However, the potential "VCGRV1-$\Delta$V" may be a negative voltage.

The voltage $\Delta$V may be appropriately set according to, for example, the voltage VSP. An example of a method of setting the voltage $\Delta$V includes the following conditions (1) to (3).

(1) As the voltage VSP becomes higher, the voltage $\Delta$V increases. Alternatively, as the voltage VSP becomes lower, the voltage $\Delta$V decreases.

(2) As the voltage VSP becomes higher, the voltage $\Delta$V decreases. Alternatively, as the voltage VSP becomes lower, the voltage $\Delta$V increases.

(3) The voltage ΔV is fixed without depending on the voltage VSP.

In the present embodiment, the condition (1) is applied.

At time t3, the row decoder module 19 starts to step up the selected word line WL_sel and applies the read voltage VCGRV1 to the selected word line WL_sel. The row decoder module 19 applies a voltage VSG to the select gate line SGD_sel and the select gate line SGS. The voltage VSG is a voltage for setting the select transistors ST1 and ST2 to be an on state. The row decoder module 19 applies the voltage VREAD to the non-selected word line WL_usel. The voltage VSG and the voltage VREAD are higher than the voltage VSP.

Thereafter, the sense amplifier module 21 detects a current of a bit line BL and determines a threshold voltage of a memory cell transistor connected to the selected word line WL_sel.

Subsequently, a second read operation is performed. At time t4, the row decoder module 19 applies a read voltage VCGRV2 (>VCGRV1) to the selected word line WL_sel. Thereafter, the sense amplifier module 21 detects a current of a bit line BL and determines a threshold voltage of a memory cell transistor connected to the selected word line WL_sel.

At time t5, voltages of the select gate line SGD, the select gate line SGS, the word line WL, the bit line BL, and the source line SL are reset.

Figure 9:
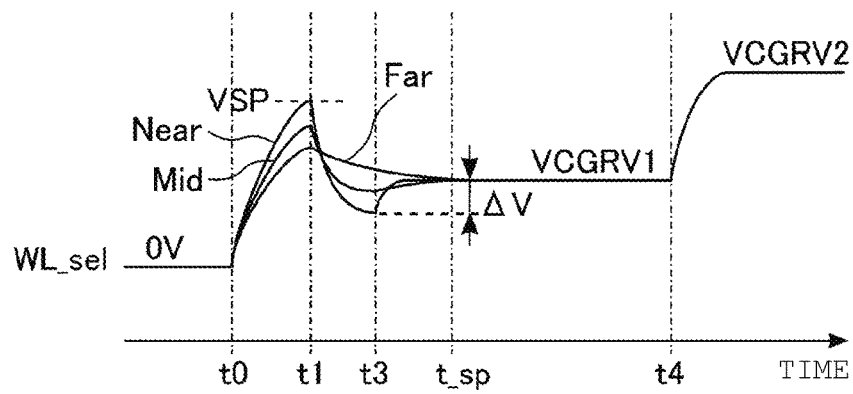
FIG. 9 is a diagram illustrating a detailed voltage waveform of a selected word line according to the first embodiment.

FIG. 9 is a diagram illustrating a detailed voltage waveform of a selected word line WL_sel. Times illustrated in FIG. 9 correspond to the times illustrated in FIG. 8.

One end of a word line WL is connected to the row decoder module 19. A plurality of memory cell transistors connected to one word line WL are divided into three groups based on the row decoder module 19. That is, a memory cell group close to the row decoder module 19 is defined as a near-side memory cell group, a memory cell group far from the row decoder module 19 is defined as a far-side memory cell group, and a memory cell group between the near side and the far side is defined as a mid memory cell group. FIG. 9 illustrates voltage waveforms of a portion corresponding to a near-side memory cell group, a portion corresponding to a mid memory cell group, and a portion corresponding to a far-side memory cell group in one word line WL.

For example, when the voltage of the word line WL is stepped up, a near-side word line portion, a mid word line portion, and a far-side word line portion have different potentials due to an RC time constant (a product of a resistance R and a capacitance C) of the word line WL. When a voltage is stepped up and stepped down, a slope of the voltage waveform of the near-side word line portion is largest, and a slope of a voltage waveform is decreased in the order of the mid word line portion and the far-side word line portion.

At time t1 in FIG. 9, in the selected word line WL_sel, the potential of the near-side word line portion is highest, and a potential becomes lower in the order of the mid word line portion and the far-side word line portion. Thereafter, the potential of the selected word line WL_sel is lowered to the voltage "VCGRV1-ΔV".

At time t3, a potential becomes lower in the order of the near-side word line portion, the mid word line portion, and the far-side word line portion. Thereafter, the read voltage VCGRV1 is applied to the selected word line WL_sel.

At time t_sp, the potential of the selected word line WL_sel is stabilized. That is, in the selected word line WL_sel, the near-side word line portion, the mid word line portion, and the far-side word line portion are set to have substantially the same potential.

In the present embodiment, in a process of lowering the potential of the selected word line WL_sel after applying the voltage VSP to the selected word line WL_sel, the potential of the far-side word line portion can be set to the read voltage VCGRV1 more rapidly. Thereby, a setup time (a time between t1 and t_sp) can be reduced.

[1-7] Effects in First Embodiment

In a comparative example, the potential of a word line WL is lowered to the ground voltage VSS after the voltage VSP is applied to the word line WL, and thereafter, the read voltage VCGRV1 is applied thereto. Here, the potential of a far-side word line portion may be lowered to a potential lower than the read voltage VCGRV1 and then set to the read voltage VCGRV1. Thereby, a period of time for which the potential of the word line is stabilized may be increased. Also when the read voltage VCGRV1 is applied to the word line WL at a timing when the potential of the far-side word line portion is not much lowered after the ground voltage VSS is applied to the word line WL, a period of time for which the far-side word line portion is stabilized to the read voltage VCGRV1 is increased.

On the other hand, in the first embodiment, the voltage VSP is applied to the selected word line WL_sel, and then the potential of the selected word line WL_sel is lowered to the voltage "VCGRV1-ΔV". Thereafter, the read voltage VCGRV1 is applied to the selected word line WL_sel.

Therefore, according to the first embodiment, it is possible to reduce a setup time from when the voltage VSP is applied to a selected word line WL_sel to when the selected word line WL_sel is stabilized to the read voltage VCGRV1. Thereby, it is possible to reduce a read time. As a result, it is possible to improve performance, particularly, read performance of the NAND-type flash memory 10.

[2] Second Embodiment

In a second embodiment, a voltage VSP for preventing an inter-band tunnel current is applied to a selected word line WL_sel, and then the voltage of the selected word line WL_sel is controlled in two steps. That is, the potential of the selected word line WL_sel is temporarily lowered to 0 V. Thereafter, a voltage "VCGRV1-ΔV" and a read voltage VCGRV1 are applied to the selected word line WL_sel in order.

[2-1] Read Operation

Figure 10:
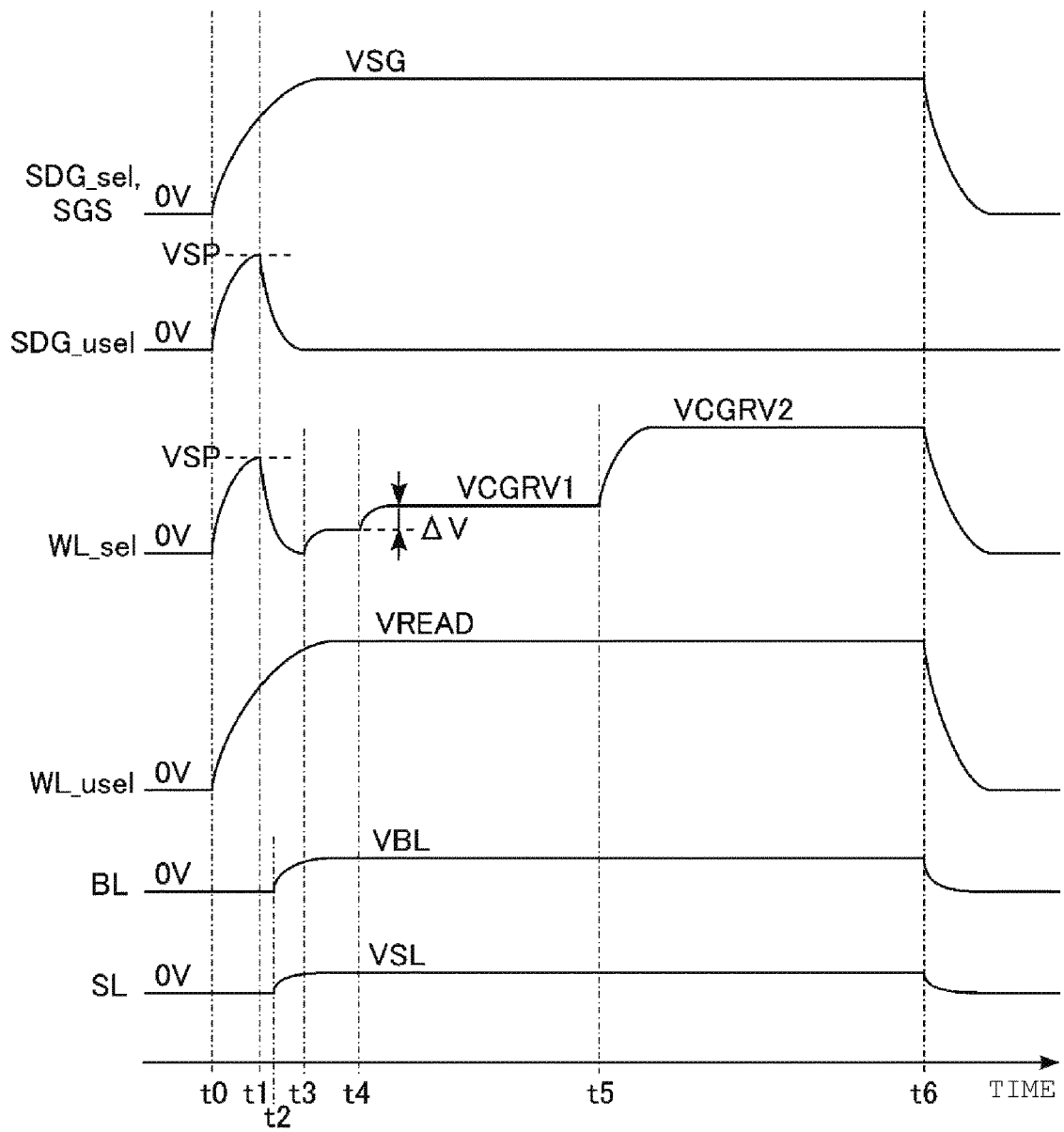
FIG. 10 is a timing diagram illustrating a read operation of a NAND-type flash memory according to a second embodiment.

A read operation of a NAND-type flash memory 10 according to the second embodiment will be described. FIG. 10 is a timing diagram illustrating a read operation of the NAND-type flash memory 10 according to the second embodiment.

At time to, a row decoder module 19 starts to step up voltages of a select gate line SGD_sel, a select gate line SGD_usel, a select gate line SGS, a selected word line WL_sel, and a non-selected word line WL_usel.

At time t1, the voltages of the select gate line SGD_sel, the select gate line SGD_usel, the selected word line WL_sel, and the non-selected word line WL_usel are stepped up to a voltage VSP. Thereby, in each NAND string, a channel is formed in a plurality of memory cell transistors, and a difference in potential between adjacent memory cell transistors is reduced.

After time t1, the row decoder module 19 steps down voltages of the selected word line WL_sel and the select gate line SGD_usel and applies 0 V to the selected word line WL_sel and the select gate line SGD_usel.

At time t2, a sense amplifier module 21 applies a voltage VBL to a bit line BL. A sequencer 16 applies a voltage VSL to a source line SL.

At time t3, the row decoder module 19 applies a voltage "VCGRV1-ΔV" to the selected word line WL_sel.

At time t4, the row decoder module 19 applies a read voltage VCGRV1 to the selected word line WL_sel. The subsequent operations are the same as those in the first embodiment.

Figure 11:
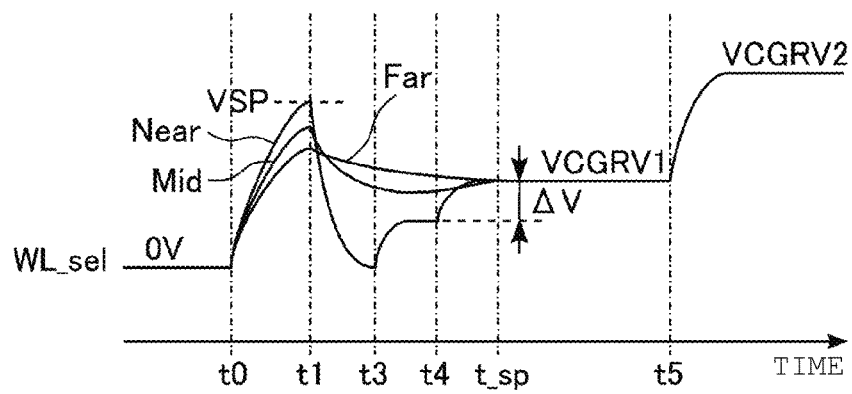
FIG. 11 is a diagram illustrating a detailed voltage waveform of a selected word line according to the second embodiment.

FIG. 11 is a diagram illustrating a detailed voltage waveform of a selected word line WL_sel. Times illustrated in FIG. 11 correspond to the times illustrated in FIG. 10.

At time t1, in the selected word line WL_sel, the potential of a near-side word line portion is highest, and a potential becomes lower in the order of mid word line portion and a far-side word line portion. Thereafter, 0 V is applied to the selected word line WL_sel. Thereby, the potential of the near-side word line portion is lowered to approximately 0 V. Here, the potentials of the mid word line portion and the far-side word line portion can be lowered more rapidly.

At time t3, the voltage of the selected word line WL_sel is started to be stepped up, and a voltage "VCGRV1-ΔV" is applied to the selected word line WL_sel. At time t4, a read voltage VCGRV1 is applied to the selected word line WL_sel.

At time t_sp, the potential of the selected word line WL_sel is stabilized. That is, in the selected word line WL_sel, the near-side word line portion, the mid word line portion, and the far-side word line portion are set to have substantially the same potential.

In the present embodiment, the potential of the selected word line WL_sel is temporarily lowered to 0 V, so that the potential of the far-side word line portion can be lowered more rapidly to near the read voltage VCGRV1. Thereby, it is possible to reduce a setup time (a time between t1 and t_sp).

[2-2] Modification Example of Second Embodiment

In the second embodiment, the potential of a selected word line WL_sel is temporarily lowered to 0 V in a period between t2 and t3. However, the voltage is not limited to 0 V, and the potential of the selected word line WL_sel may be lowered to a negative voltage in the period between t2 and t3. After a negative voltage is applied to the selected word line WL_sel, a voltage "VCGRV1-ΔV" is applied to the selected word line WL_sel.

According to the modification example, the potential of a far-side word line portion can be lowered more rapidly.

[2-3] Effects in Second Embodiment

In the second embodiment, after the voltage VSP for preventing an inter-band tunnel current is applied to the selected word line WL_sel, 0 V and the voltage "VCGRV1-ΔV" are applied to the selected word line WL_sel in order. Thereafter, the read voltage VCGRV1 is applied to the selected word line WL_sel.

Therefore, according to the second embodiment, it is possible to reduce a setup time from when the voltage VSP is applied to the selected word line WL_sel to when the selected word line WL_sel is stabilized to the read voltage VCGRV1. Thereby, it is possible to reduce a read time. As a result, it is possible to improve performance, particularly, read performance of the NAND-type flash memory 10.

[3] Third Embodiment

A third embodiment is an example in which a read operation using a relatively low read voltage is performed after a read operation using a relatively high read voltage is performed. For example, a relatively high read voltage VCGRV2 (>VCGRV1) is used in a first read operation, and a relatively low read voltage VCGRV1 is used in a second read operation.

[3-1] Read Operation

Figure 12:
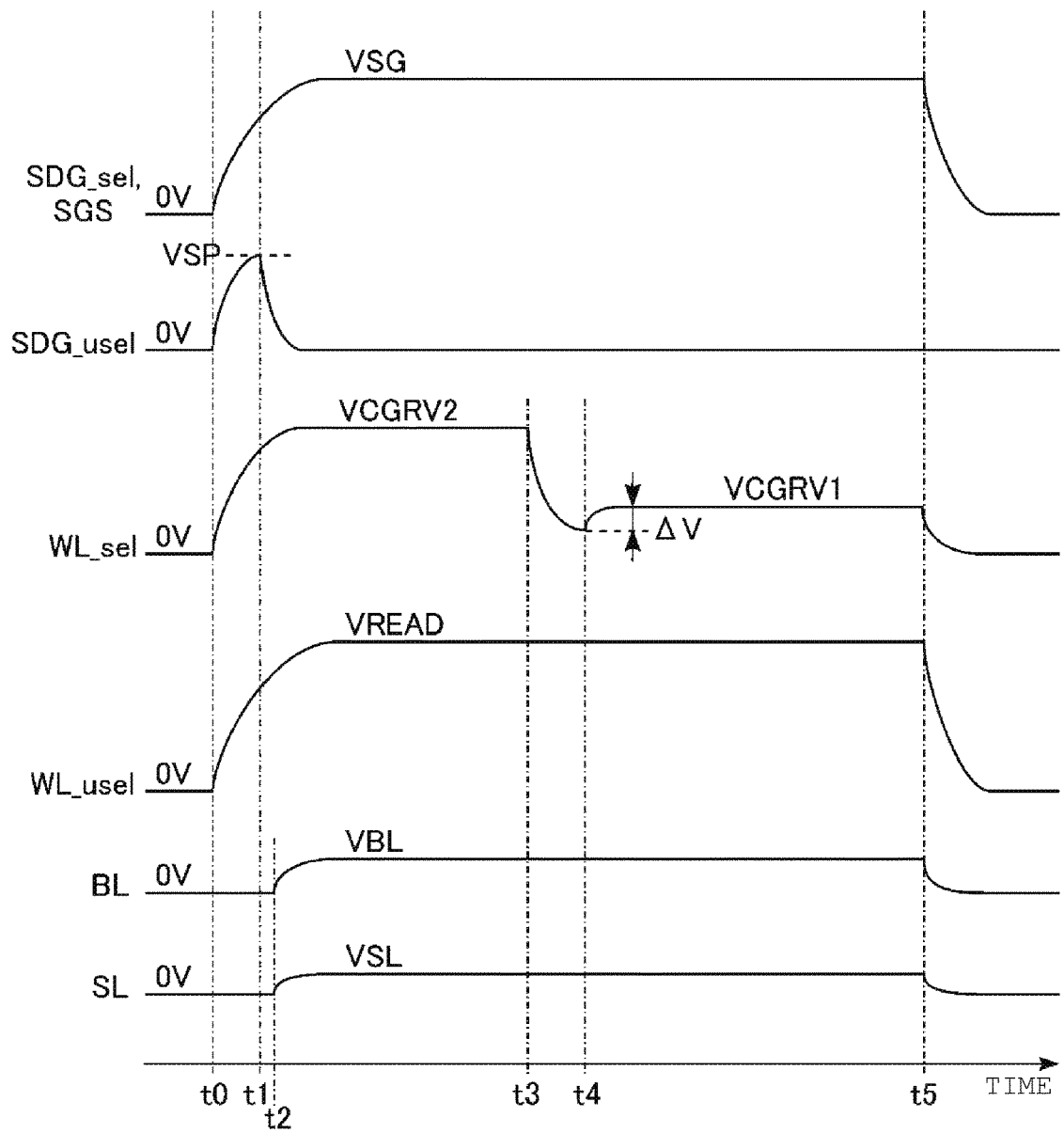
FIG. 12 is a timing diagram illustrating a read operation of a NAND-type flash memory according to a third embodiment.

A read operation of a NAND-type flash memory 10 according to the third embodiment will be described. FIG. 12 is a timing diagram illustrating a read operation of the NAND-type flash memory 10 according to the third embodiment. Hereinafter, a case where two read operations are consecutively performed will be described as an example.

First, a first read operation is performed. At time t0, a row decoder module 19 starts to step up voltages of a select gate line SGD_sel, a select gate line SGD_usel, a select gate line SGS, a selected word line WL_sel, and a non-selected word line WL_usel.

At time t1, the voltages of the select gate line SGD_sel, the select gate line SGD_usel, the selected word line WL_sel, and the non-selected word line WL_usel are stepped up to a voltage VSP. Thereby, in each NAND string, a channel is formed in a plurality of memory cell transistors, and a difference in potential between adjacent memory cell transistors is reduced.

After time t1, the row decoder module 19 applies a voltage VSG to the select gate line SGD_sel, applies 0 V to the select gate line SGD_usel, applies a read voltage VCGRV2 to the selected word line WL_sel, and applies a voltage VREAD to the non-selected word line WL_usel.

At time t2, a sense amplifier module 21 applies a voltage VBL to a bit line BL. A sequencer 16 applies a voltage VSL to a source line SL. Thereafter, the sense amplifier module 21 detects a current of the bit line BL and determines a threshold voltage of a memory cell transistor connected to the selected word line WL_sel.

Subsequently, a second read operation is performed. At time t3, the row decoder module 19 steps down the voltage of the selected word line WL_sel and applies a voltage "VCGRV1-ΔV" to the selected word line WL_sel. Conditions of the voltage "VCGRV1-ΔV" are the same as those in the first embodiment. The read voltage VCGRV1 is lower than the read voltage VCGRV2.

At time t4, the row decoder module 19 applies a read voltage VCGRV1 to the selected word line WL_sel. Thereafter, the sense amplifier module 21 detects a current of a bit line BL and determines a threshold voltage of a memory cell transistor connected to the selected word line WL_sel.

At time t5, voltages of the select gate line SGD, a select gate line SGS, a word line WL, a bit line BL, and a source line SL are reset.

Figure 13:
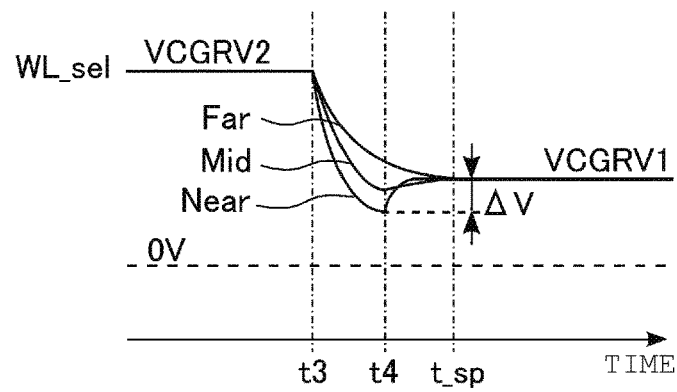
FIG. 13 is a diagram illustrating a detailed voltage waveform of a selected word line according to the third embodiment.

FIG. 13 is a diagram illustrating a detailed voltage waveform of a selected word line WL_sel. Times illustrated in FIG. 13 correspond to the times illustrated in FIG. 12.

In a period between t3 and t4, the potential of the selected word line WL_sel is lowered to a voltage "VCGRV1-ΔV". The potential is rapidly lowered in the order of a near-side word line portion, a mid word line portion, and a far-side word line portion in the selected word line WL_sel due to an RC time constant. At time t4, the potential of the near-side word line portion is lowest, and a potential becomes higher in the order of the mid word line portion and the far-side word line portion. The potential of the near-side word line portion is approximately a voltage "VCGRV1-ΔV".

Thereafter, a voltage VCGRV1 is applied to the selected word line WL_sel. At time t_sp, the potential of the selected word line WL_sel is stabilized. That is, in the selected word line WL_sel, the near-side word line portion, the mid word line portion, and the far-side word line portion are set to have substantially the same potential.

In the present embodiment, the selected word line WL_sel is lowered to the voltage "VCGRV1-ΔV", and thus it is possible to prevent the potential of the far-side word line portion from greatly falling more than a read voltage VCGRV1. Thereby, it is possible to reduce a setup time (a period between t3 and t_sp).

[3-2] Effects in Third Embodiment

In the third embodiment, in consecutive two read operations, a first read voltage VCGRV2 is set to be relatively high, and a second read voltage VCGRV1 is set to be relatively low. In the second read operation, after the potential of the selected word line WL_sel is lowered to the voltage "VCGRV1-ΔV", the read voltage VCGRV1 is applied to the selected word line WL_sel.

Therefore, according to the third embodiment, it is possible to reduce a setup time from when the first read voltage VCGRV2 is applied to the selected word line WL_sel to when the selected word line WL_sel is stabilized to the second read voltage VCGRV1. Thereby, it is possible to reduce a read time. As a result, it is possible to improve performance, particularly, read performance of the NAND-type flash memory 10.

Meanwhile, the second embodiment may also be applied to the third embodiment.

The third embodiment may also be applied to a case where three or more read operations are consecutively performed when a process of performing a read operation using a relatively low read voltage VCGRV1 is included after a read operation using a relatively high read voltage VCGRV2 is performed. Specifically, in a case of performing three reading operations, a voltage becomes higher in the order of a reading voltage VCGRV1, a reading voltage VCGRV2, and a reading voltage VCGRV3. Here, the read operations are performed in the order of the read voltage VCGRV1, the read voltage VCGRV3, and the read voltage VCGRV2. That is, the read operations are performed in the order of a relatively low read voltage, a high read voltage, and a middle read voltage. A voltage "VCGRV2-ΔV" is applied to a selected word line WL_sel before the read operation using the read voltage VCGRV2 is performed. In this case, the first embodiment may also be applied to the first read operation using the read voltage VCGRV1.

In the present specification, the term "connection" refers to being electrically connected and does not exclude, for example, a case where another element is interposed between two connected elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a plurality of first memory cells which are connected to each other in series;
a plurality of word lines which are respectively connected to gates of the first memory cells, the word lines including a first word line connected to the gate of one of the first memory cells;
a bit line which is connected to a first end of the first memory cells;
a source line which is connected to a second end of the first memory cells;
a first select transistor which is connected between the bit line and the first memory cells;
a second select transistor which is connected between the source line and the first memory cells;
a first select gate line which is connected to a gate of the first select transistor;
a second select gate line which is connected to a gate of the second select transistor; and
a control circuit configured to perform a read operation by applying a first voltage higher than ground voltage to the plurality of word lines, the first select gate line, and the second select gate line, during a first time period at the beginning of which each of the word lines is at ground voltage,
applying a second voltage lower than the first voltage to the first word line, a third voltage to the bit line, and a fourth voltage lower than the third voltage to the source line, during a second time period subsequent to the first time period,
applying a fifth voltage higher than the second voltage to the first word line during a third time period subsequent to the second time period, and
determining data of the one of the first memory cells connected to the first word line while all portions of the first word line are at the third voltage.

2. The semiconductor storage device according to claim 1, the third voltage is applied to the bit line, and the fourth voltage is applied to the source line, after a beginning of the second time period, and
the third voltage applied to the bit line and the fourth voltage applied to the source line are maintained, during the third time period.

3. The semiconductor storage device according to claim 2, further comprising:
a plurality of second memory cells which are connected to each other in series, the word lines being respectively connected to gates of the second memory cells;
a third select transistor which is connected between the bit line and the second memory cells;
a fourth select transistor which is connected between the source line and the second memory cells, the second select gate line being connected to a gate of the fourth select transistor; and
a third select gate line which is connected to a gate of the third select transistor; wherein
the first voltage is applied to the third select gate line during the first time period, and
a sixth voltage lower than the second voltage is applied to the third select gate line during the second and third time periods.

4. The semiconductor storage device according to claim 1, wherein the second voltage is higher than the ground voltage.

5. The semiconductor storage device according to claim 1, wherein the first voltage, the second voltage, and the fifth voltage are applied in succession to the first word line, and no other voltages are applied to the first word line between the beginning of the first time period and the end of the third time period.

6. The semiconductor storage device according to claim 1, wherein the portions of the first word line includes first, second, and third portions, the first portion being closest to a location where the first, second, and fifth voltages are applied to the first word line and the third portion being farthest from the location where the first, second, and fifth voltages are applied to the first word line.

7. The semiconductor storage device according to claim 1, wherein threshold voltages of the first memory cells are at one of eight different states, and the second voltage is set to be less than a seventh voltage by less than a predetermined voltage, wherein the seventh voltage is a voltage that is higher than a maximum possible threshold voltage of the first memory cells in the eight different states.

8. The semiconductor storage device according to claim 7, wherein the predetermined voltage is a minimum potential difference for causing an inter-band tunnel current between adjacent first memory cells.

9. The semiconductor storage device according to claim 7, wherein the fifth voltage is higher than the second voltage by approximately 0.5 V.

10. A semiconductor storage device comprising:
a plurality of first memory cells which are connected to each other in series;
a plurality of word lines which are respectively connected to gates of the first memory cells, the word lines including a first word line connected to the gate of one of the first memory cells;
a bit line which is connected to a first end of the first memory cells;
a source line which is connected to a second end of the first memory cells;
a first select transistor which is connected between the bit line and the first memory cells;
a second select transistor which is connected between the source line and the first memory cells;
a first select gate line which is connected to a gate of the first select transistor;
a second select gate line which is connected to a gate of the second select transistor; and
a control circuit configured to perform a read operation by
applying a first voltage higher than ground voltage to the first word line, a second voltage higher than the ground voltage to the first and second select gate lines, a third voltage to the bit line, and a fourth voltage lower than the third voltage to the source line, during a first time period at the beginning of which the first word line is at ground voltage,
determining data of the one of the memory cells connected to the first word line during the first time period after the first word line has increased to the first voltage from the ground voltage;
applying a fifth voltage lower than the first voltage and higher than the ground voltage to the first word line during a second time period subsequent to the first time period,
applying a sixth voltage higher than the fifth voltage to the first word line during a third time period subsequent to the second time period, and
further determining the data of the one of the memory cells connected to the first word line while all portions of the first word line are at the sixth voltage.

11. The semiconductor storage device according to claim 10, wherein
the third voltage is applied to the bit line and the fourth voltage is applied to the source line, after the first voltage is applied to the first word line.

12. The semiconductor storage device according to claim 11, further comprising:

a plurality of second memory cells which are connected to each other in series, the word lines being respectively connected to gates of the second memory cells;
a third select transistor which is connected between the bit line and the second memory cells;
a fourth select transistor which is connected between the source line and the second memory cells, the second select gate line being connected to a gate of the fourth select transistor; and
a third select gate line which is connected to a gate of the third select transistor; wherein
a seventh voltage higher than the fifth voltage is applied to the third select gate line during the first time period, and
an eighth voltage lower than the seventh voltage is applied to the third select gate line during the second and third time periods.

13. The semiconductor storage device according to claim 10, wherein the first voltage, the fifth voltage, and the sixth voltage are applied in succession to the first word line, and no other voltages are applied to the first word line between the beginning of the first time period and the end of the third time period.

14. The semiconductor storage device according to claim 10, wherein the portions of the first word line includes first, second, and third portions, the first portion being closest to a location where the first, fifth, and sixth voltages are applied to the first word line and the third portion being farthest from the location where the first, fifth, and sixth voltages are applied to the first word line.

15. The semiconductor storage device according to claim 10, wherein the sixth voltage is higher than the fifth voltage by approximately 0.5 V.

16. A method of performing a read operation on a semiconductor storage device that includes a plurality of first memory cells which are connected to each other in series, a plurality of word lines which are respectively connected to gates of the first memory cells, the word lines including a first word line connected to the gate of one of the first memory cells, a bit line which is connected to a first end of the first memory cells, a source line which is connected to a second end of the first memory cells, a first select transistor which is connected between the bit line and the first memory cells, a second select transistor which is connected between the source line and the first memory cells, a first select gate line which is connected to a gate of the first select transistor, and a second select gate line which is connected to a gate of the second select transistor, said method comprising:
applying a first voltage higher than ground voltage to the plurality of word lines, the first select gate line, and the second select gate line, during a first time period at the beginning of which each of the word lines is at ground voltage,
applying a second voltage lower than the first voltage to the first word line, a third voltage to the bit line, and a fourth voltage lower than the third voltage to the source line, during a second time period subsequent to the first time period,
applying a fifth voltage higher than the second voltage to the first word line during a third time period subsequent to the second time period, and
determining data of the one of the first memory cells connected to the first word line while all portions of the first word line are at the third voltage.

17. The method according to claim 16, wherein the second voltage is higher than the ground voltage.

18. The method according to claim 16, wherein the first voltage, the second voltage, and the fifth voltage are applied in succession to the first word line, and no other voltages are applied to the first word line between the beginning of the first time period and the end of the third time period.

19. The method according to claim 16, wherein the portions of the first word line includes first, second, and third portions, the first portion being closest to a location where the first, second, and fifth voltages are applied to the first word line and the third portion being farthest from the location where the first, second, and fifth voltages are applied to the first word line.

20. The method according to claim 16, wherein threshold voltages of the first memory cells are at one of eight different states, and the second voltage is set to be less than a seventh voltage by less than a predetermined voltage, wherein the seventh voltage is a voltage that is higher than a maximum possible threshold voltage of the first memory cells in the eight different states, and the predetermined voltage is a minimum potential difference for causing an inter-band tunnel current between adjacent first memory cells.

* * * * *

UNITED STATES PATENT AND TRADEMARK OFFICE
CERTIFICATE OF CORRECTION

| | |
|---|---|
| PATENT NO. | : 11,205,482 B2 |
| APPLICATION NO. | : 16/806282 |
| DATED | : December 21, 2021 |
| INVENTOR(S) | : Takeshi Hioka et al. |

It is certified that error appears in the above-identified patent and that said Letters Patent is hereby corrected as shown below:

In the Claims

In Column 16, Line 30, please replace "claim 1, the third" with --claim 1, wherein the third--.

Signed and Sealed this
First Day of November, 2022

Katherine Kelly Vidal
*Director of the United States Patent and Trademark Office*